United States Patent
Ewe et al.

(10) Patent No.: US 10,429,459 B2
(45) Date of Patent: Oct. 1, 2019

(54) FORMATION PROPERTY MEASUREMENT APPARATUS, METHODS, AND SYSTEMS

(71) Applicant: Halliburton Energy Services, Inc., Houston, TX (US)

(72) Inventors: Wei-Bin Ewe, Singapore (SG); Burkay Donderici, Pittsford, NY (US); Glenn A. Wilson, Houston, TX (US); Luis Emilio San Martin, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 147 days.

(21) Appl. No.: 15/564,627

(22) PCT Filed: Apr. 16, 2015

(86) PCT No.: PCT/US2015/026164
§ 371 (c)(1),
(2) Date: Oct. 5, 2017

(87) PCT Pub. No.: WO2016/167771
PCT Pub. Date: Oct. 20, 2016

(65) Prior Publication Data
US 2018/0088191 A1    Mar. 29, 2018

(51) Int. Cl.
*G01R 33/3415*    (2006.01)
*G01V 3/26*       (2006.01)
(Continued)

(52) U.S. Cl.
CPC .... *G01R 33/3415* (2013.01); *E21B 47/02224* (2013.01); *E21B 47/123* (2013.01); *G01R 33/4831* (2013.01); *G01V 3/26* (2013.01)

(58) Field of Classification Search
CPC .............................. G01V 3/26; G01R 33/3415
See application file for complete search history.

(56) References Cited

U.S. PATENT DOCUMENTS

| | | | |
|---|---|---|---|
| 2008/0224705 A1 | 9/2008 | Simon et al. | |
| 2013/0120218 A1* | 5/2013 | Kuo | H01Q 3/24 343/876 |
| 2014/0368199 A1* | 12/2014 | Bittar | E21B 7/04 324/337 |

FOREIGN PATENT DOCUMENTS

WO    2003048813 A1    6/2003

OTHER PUBLICATIONS

"International Application Serial No. PCT/US2015/026164, International Search Report dated Dec. 16, 2015", 4 pgs.
(Continued)

*Primary Examiner* — Minh Q Phan
(74) *Attorney, Agent, or Firm* — Gilliam IP PLLC

(57) ABSTRACT

In some embodiments, an apparatus and a system, as well as methods, may include operating a transmitting antenna and a receiving antenna as equivalent tilted dipoles, wherein the tilted dipoles provide a selection of equivalent tilt angles for at least one of the transmitting antenna or the receiving antenna. Further activity may comprise receiving signals by the receiving antenna disposed in a geological formation, the signals to be inverted to obtain at least one of resistivity or dielectric constant properties of the geological formation at a selected depth of investigation, the depth determined by the selection of the equivalent tilt angles and weighting with pre-computed integrated radial sensitivity signal data. Additional methods, apparatus, and systems are disclosed.

21 Claims, 11 Drawing Sheets

(51) Int. Cl.
*E21B 47/022* (2012.01)
*E21B 47/12* (2012.01)
*G01R 33/483* (2006.01)

(56) References Cited

OTHER PUBLICATIONS

"International Application Serial No. PCT/US2015/026164, Written Opinion dated Dec. 16, 2015", 6 pgs.

* cited by examiner

FORMATION PROPERTY MEASUREMENT APPARATUS, METHODS, AND SYSTEMS

BACKGROUND

Understanding the structure and properties of geological formations may reduce the cost of drilling wells for oil and gas exploration. Measurements are typically performed in a borehole (i.e., down hole measurements) in order to attain this understanding. For example, the measurements may identify the composition and distribution of material that surrounds the measurement device down hole. To obtain such measurements, a variety of sensors and mounting configurations may be used. These apparatus include antennae that are used to provide nuclear magnetic resonance (NMR) measurements, and antennae to provide resistivity measurements, as well as others.

The measurements made by conventional high frequency dielectric tools can be used to determine the formation dielectric constant (also referred to as the relative permittivity) and resistivity at a depth-of-investigation (DOI) that depends on the formation characteristics. However, these tools tend to operate in single polarization mode (i.e., the broadside mode), so that the DOI is fixed.

DETAILED DESCRIPTION

In order to dynamically control the DOI, additional information, including data obtained from other polarization modes, can be utilized. To address the challenges noted above, as well as others, many embodiments include a dielectric tool that can determine the formation dielectric constant (also referred to as the relative permittivity) and resistivity at a substantially constant and controllable DOI by using different antenna polarizations.

The additional polarization modes can be achieved mechanically, or electronically. Antennas that can operate in different polarization modes can be represented by a tilted equivalent magnetic dipole with respect to the tool axis.

Figure 2:
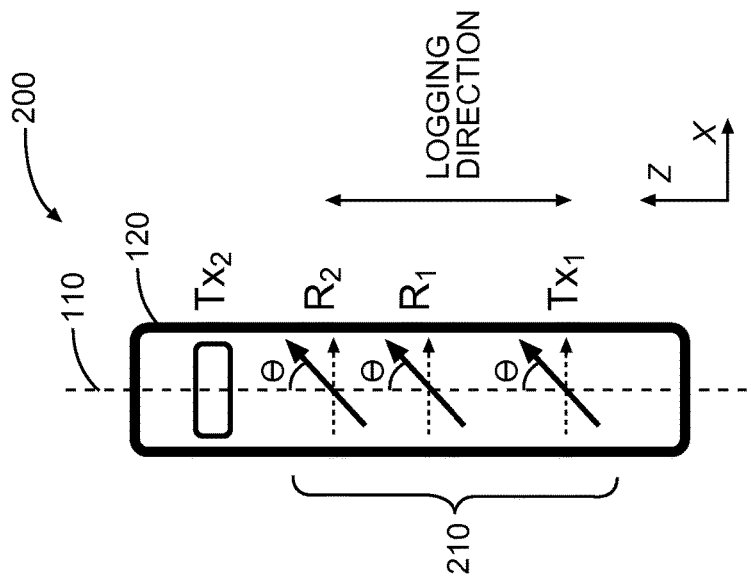
FIGS. 1-2 are side-views of mechanically and electrically tilted equivalent magnetic dipole antenna arrays, respectively, that can be oriented at an angle θ with respect to the longitudinal axis of the associated housing, according to various embodiments of the invention.
Figure 1:
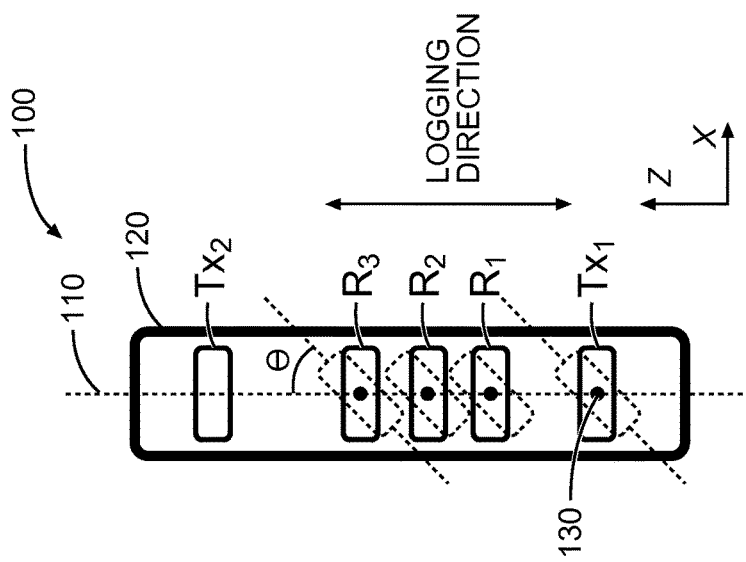

For example, FIGS. 1-2 are side-views of mechanically and electrically tilted equivalent magnetic dipole antenna arrays 100, 200, respectively, that can be oriented at an angle θ with respect to the longitudinal axis 110 of the associated housing 120, according to various embodiments of the invention.

Turning the discussion to FIG. 1, it can be seen that achieving additional polarization modes mechanically may involve the physical movement of one or more antennas in an array 100, through and angle θ with respect to the longitudinal tool axis. Here, the transmitter antenna Tx1 and the receiver antennas R1, R2, R3 are shown operating in a conventional broadside mode. However, after mechanical rotation through the angle θ, perhaps using an actuation mechanism 130 attached to the housing 120 and comprising one or more of electric motors, hydraulics, or solenoids, they can operate in a tilted mode, which adjusts the DOI. In the figure, the tilted mode for the transmitter antenna Tx1 and the receiver antennas R1, R2, R3 is shown using dashed lines.

In FIG. 2, a tilted magnetic dipole array 200 consists of a transmitter (Tx) and two receivers (R1 and R2) having a tilt angle θ with respect to the tool axis. When the tilt angle θ=90° (i.e., the tilt angle is perpendicular to the longitudinal axis 110, as shown by the dashed arrows), the array 200 can operate in the conventional broadside mode.

In some embodiments, a single receiver (e.g., R1) can be used. In that case, the phase difference can be measured from the transmitter Tx1 to the receiver R1, and the amplitude ratio can be measured as the ratio of transmitter Tx1 voltage or current to the receiver R1 signal. Making measurements in this way, using a single transmitter-referenced-receiver combination, may provide sufficient resolution for a number of downhole investigation tasks.

It should be noted that achieving additional polarization modes electronically can be accomplished using non-symmetrically-shaped (e.g., rectangular) antennas 210, or symmetrical antennas, such as multi-feed circular cavity, or square antenna configurations, the shapes of which are well-known to those of ordinary skill in the art.

Figure 3:
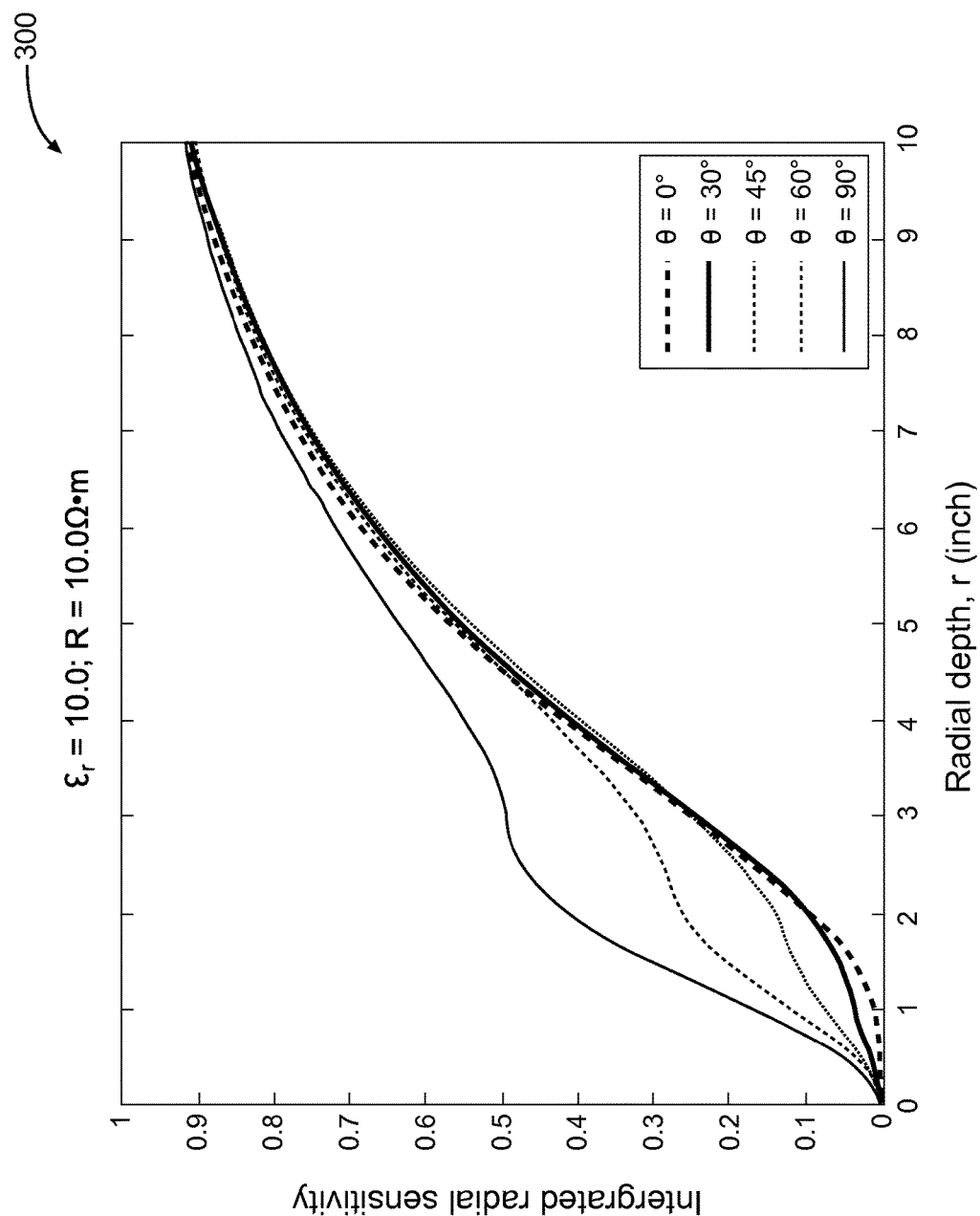
FIGS. 3-4 are graphs indicating the actual and weighted average responses, respectively, for computed integrated radial sensitivity of an antenna array in a formation having a dielectric constant $\in_r = 10$ and a resistivity R=10 Ω·m, according to various embodiments of the invention.
Figure 4:
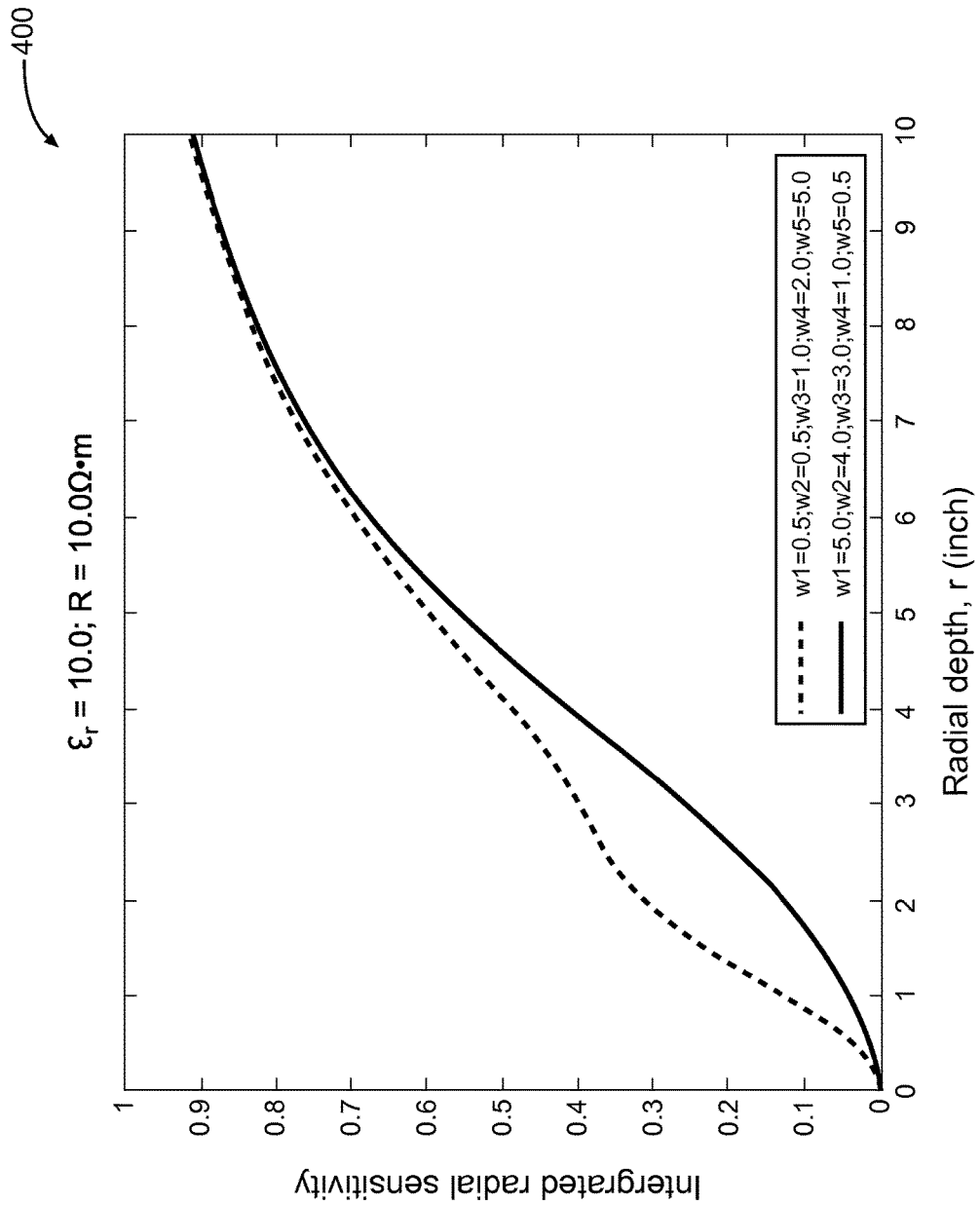

FIGS. 3-4 are graphs 300, 400 indicating the actual and weighted average responses, respectively, for computed integrated radial sensitivity (IRS) of an antenna array in a formation having a dielectric constant $\in_r = 10$ and a resistivity R=10 Ω·m, according to various embodiments of the invention. In this example, five different tilt angles: θ=0°, 30°, 45°, 60° and 90° are considered in the computation. In the figure, for each tilt angle, the IRS of the ratio between receiver R1 and R2 in response to the transmitter Tx1 is computed and plotted. It is observed that the θ=0° produces the deepest IRS, which is reduced as the θ increases toward 90°.

In FIG. 4, the IRS is obtained from the weighted average of the integrated radial sensitivities of the five different tilt angles θ using equation (1):

$$\text{Weighted } IRS = \frac{\sum_i w_i IRS(\theta_i)}{\sum_i w_i}. \tag{1}$$

Two different sets of weights (indicated by the solid, and dashed lines, respectively) have been implemented in the graph 400 to illustrate that the IRS can be controlled by using different weights.

Figure 5:
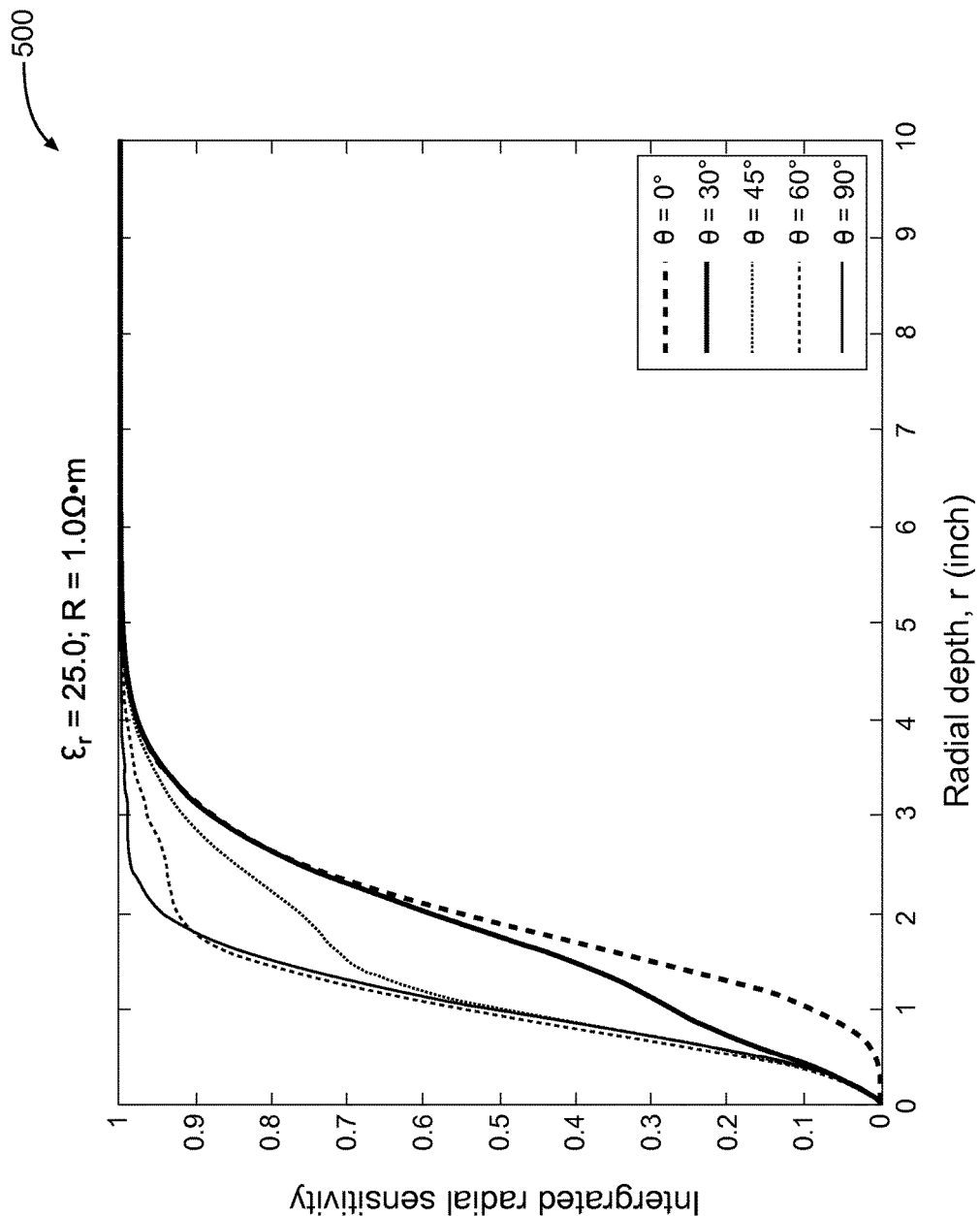
FIGS. 5-6 are graphs indicating the actual and weighted average responses, respectively, for computed integrated radial sensitivity of an antenna array in a formation having a dielectric constant $\in_r = 25$ and a resistivity R=1 Ω·m, according to various embodiments of the invention.
Figure 6:
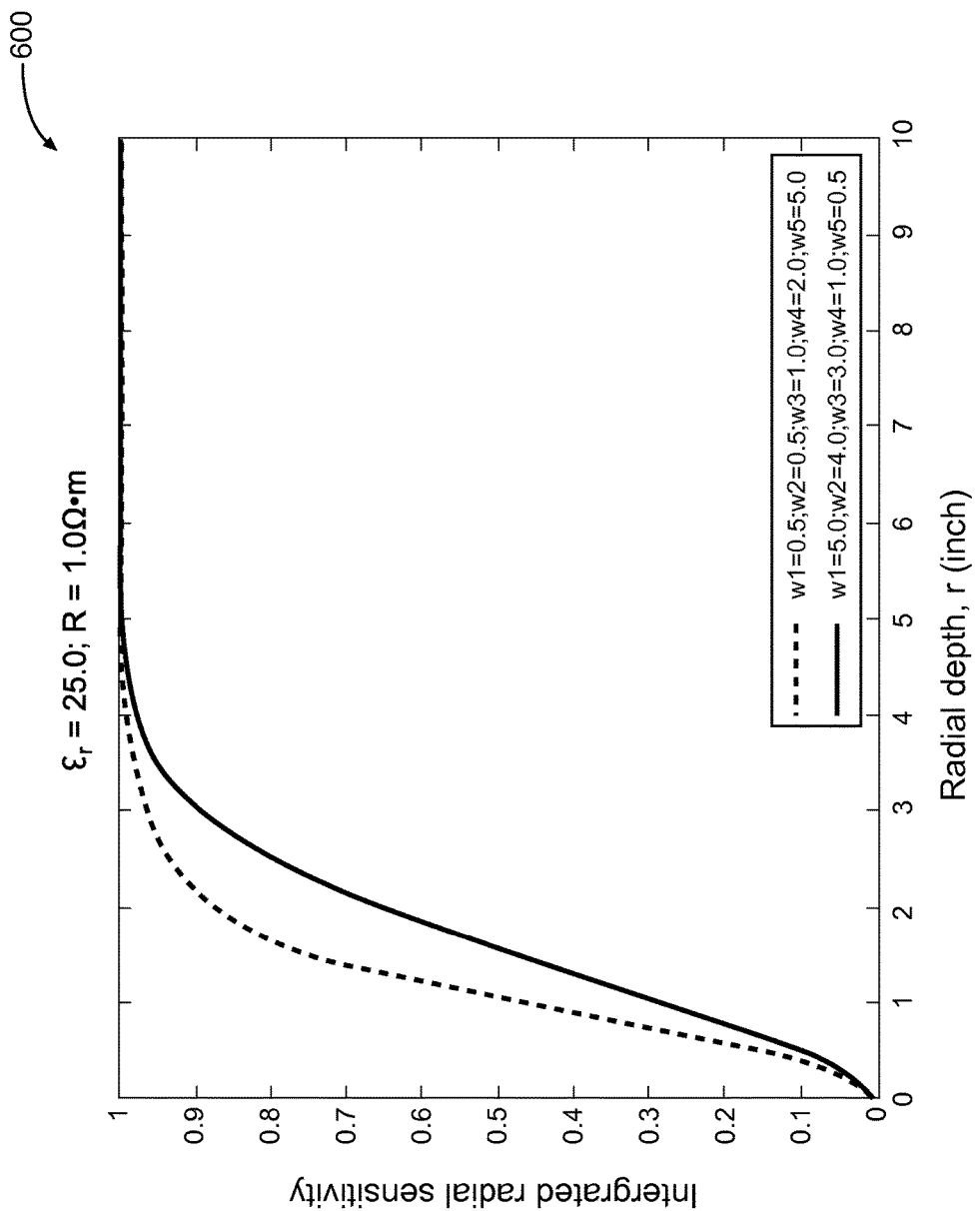

FIGS. 5-6 are graphs 500, 600 indicating the actual and weighted average responses, respectively, for computed integrated radial sensitivity of an antenna array in a formation having a dielectric constant $\in_r=25$ and a resistivity R=1 Ω·m, according to various embodiments of the invention. In this example, the results similar to those shown in FIG. 3, but the background medium has a dielectric constant this is twice that of FIG. 3, and a resistivity that is one-tenth the value of FIG. 3. Here, the IRS of five different tilt angles are also computed and plotted.

In FIG. 6, the IRS curves for different weights are again shown, being computed from the weighted average of the five IRS values obtained in FIG. 5, using equation (1). Once again, it is demonstrated that the resultant IRS is controllable by using different sets of weights, indicated by the solid and dashed lines. The weights obtained from different values of the DOI can then be applied to the measurement data and formation property information can be subsequently obtained through inversion.

Figure 7:
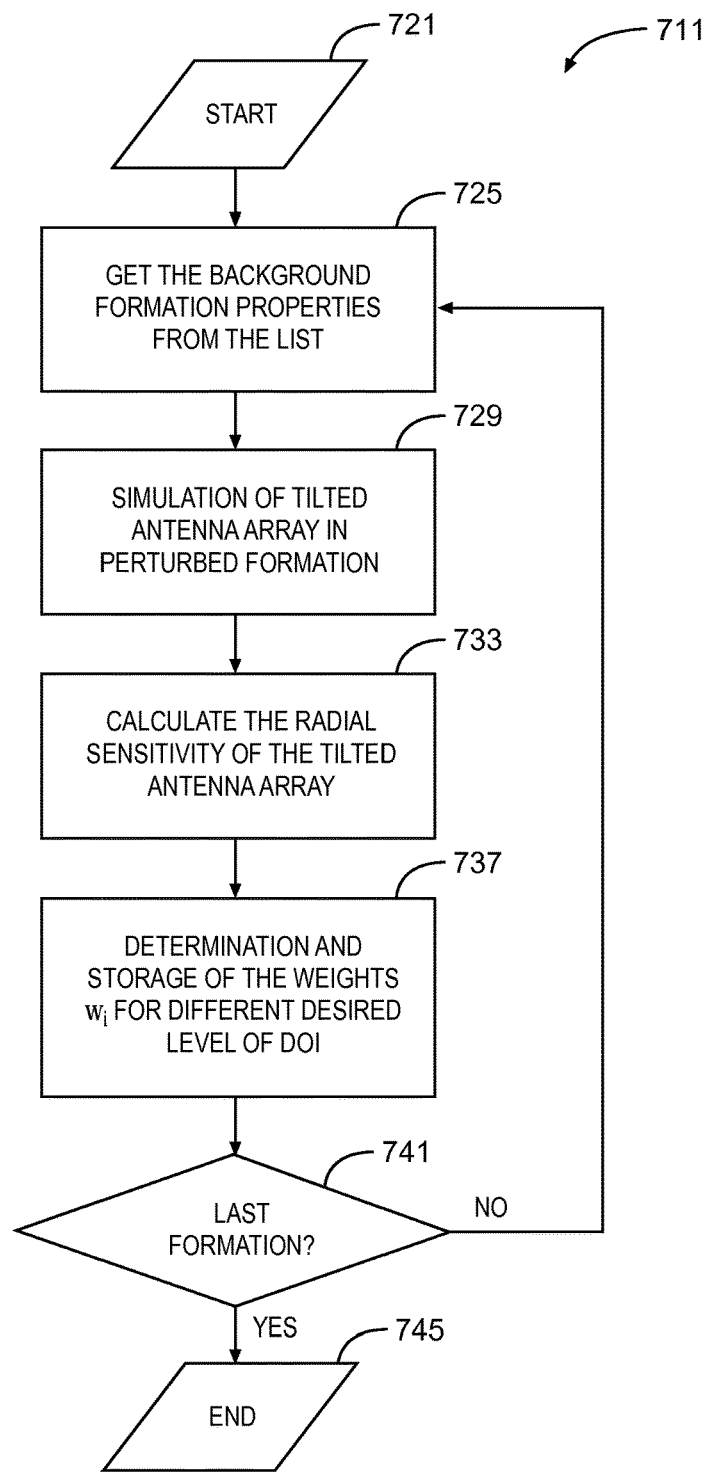
FIG. 7 is a flow diagram for a method of constructing look-up table of weights, according to various embodiments of the invention.

FIG. 7 is a flow diagram for a method 711 of constructing look-up table of weights, according to various embodiments of the invention. The weights can be determined during inversion or interpolated from a precomputed look-up table. The look-up table can be constructed by simulation of response(s) over a range of dielectric constant and resistivity, and calculation of the weights of different level of DOI through matrix inversion.

Thus, in some embodiments, the method 711 begins at block 721 and continues on to block 725 with obtaining background formation properties from a list—perhaps for a set of depths (e.g., resistivity 0.1-10,000 ohm*m, dielectric constant 1-150). The list may exist in the form of a large table containing all possible expected combinations of data.

The method 711 may continue on to block 729, with simulating array activity in the formation, to determine the resulting received signal.

The method 711 may continue on to block 733 with calculating the radial sensitivity of the array, using the signals resulting from the activity at block 729. Radial sensitivity may be calculated by considering a medium consisting of two or more layers separated by cylindrical boundaries, and by varying the size of the cylinders. Radial sensitivity may alternatively be calculated through a Born approximation, although this method may be less accurate for the operating range of a dielectric tool. Both methods of radial sensitivity calculation are well known to a person of ordinary skill in the art, and are documented in numerous publications.

At block 737, the method 711 may include a determination of the weights for a desired DOI, perhaps using trial and error (e.g., via plotting and inspect the results, such as those shown in FIGS. 3 and 5), or a formulaic approach to minimize a desired convergence value, such as finding a set of weights to achieve the desired DOI at a desired IRS. Mathematical optimization algorithms that are well known to those of ordinary skill in the art can be used to accomplish this task.

The method 711 may continue on to block 741, iterating through blocks 725-737 for every combination of properties and depths that are included in the list of block 725. When the list has been exhausted, the method 711 may conclude at block 745.

Figure 8:
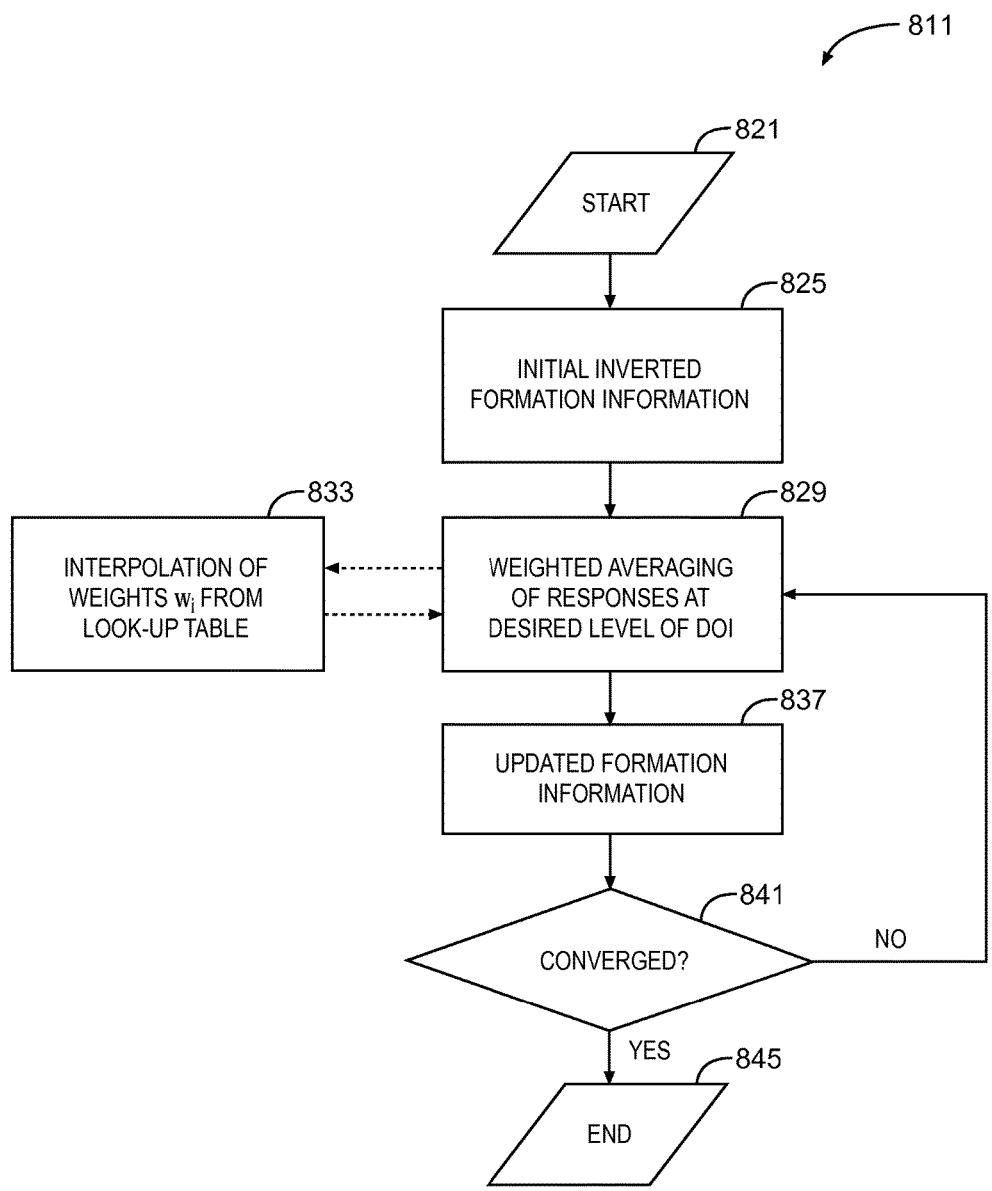
FIG. 8 is a flow diagram for a method of inverting measurements obtained from a dielectric tool constructed and operated according to various embodiments of the invention.

FIG. 8 is a flow diagram for a method 811 of inverting measurements obtained from a dielectric tool constructed and operated according to various embodiments of the invention. Here the diagram continues the implementation of various embodiments, after the weights determined as part of the activities shown in FIG. 7 have been determined. At this point, the weights, perhaps stored in the form of a look-up table, can be used in conjunction with the inversion of data obtained from a downhole tool, such as a dielectric tool.

In this method 811, the initial formation model is first inverted from the measurement data. Then, based on the initial formation model, the weights can be interpolated from the look-up table and used to average the responses of the measured data over different polarization modes. Then averaged data can then be used to obtain new formation information, and to check the convergence of the formation model. The procedures of retrieving weights from the look-up table and averaging the responses iterate until the formation model converges.

Thus, in some embodiments, the method 811 begins at block 821, and continues on to block 825 with obtaining initial inverted formation information using initial measurement values obtained from a downhole tool. These initial values may take the form of antenna signals, such as those illustrated in FIG. 3 or 5.

The method 811 may continue on to block 829 with applying weights to the signals (e.g., for this formation, at the desired DOI, with weights that give the highest sensitivity). Depending on the data that has been measured, the method 811 may include, at block 833, interpolation of the weight values in the look-up table. Weighting of signals can be accomplished by using equation (2):

$$SW=W1*S1+W2*S2+ \quad (2)$$

where SW is the weighted signal, W1 is the first weight, S1 is the first signal, W2 is the second weight and S2 is the second signal, and so forth. Equation (2) includes two averaging terms which is a useful number, however if more signals are available, more weighting terms can be used. Signals may take the form of voltages, currents, phases, amplitudes, phase differences or amplitude ratios, as well as combinations of these. Received signal values can be averaged before or after weighting values are applied.

The method 811 may further include, at block 833, iterative interpolation at different depths of inspection, to obtain get the DOI that is desired. If the table already contains weight values for the DOI in question, interpolation at block 833 may be avoided.

The method 811 may continue on to block 837, to include updating formation information by inverting the weighted versions of the signals (determined at block 829, based on the original signals obtained at block 825) to determine formation properties. This determination may include mapping measured signals, such as phase difference and amplitude ratio to formation properties, such as resistivity and dielectric constant. For example, after the resistivity and dielectric constant are obtained, petrophysical parameters such as water saturation may be calculated. This process is well-known to those of ordinary skill in the art, and documented in a number of publications.

At block 841, the method 811 may include checking the inversion results to evaluate whether different DOI property results are converging. This occurs when, for example, the results of the activity at block 837 (e.g., formation properties) are consistent across different depths of inspection. When this occurs, the method 811 may conclude at block 845.

If instead the results diverge (e.g., formation properties determined at block 837 are not consistent across different depths of inspection), this may signal an approaching transition zone, and further investigation may be useful. Thus, the method 811 may include iteration between blocks 829, 833, 837, and 841. Still further embodiments may be realized.

Figure 9:
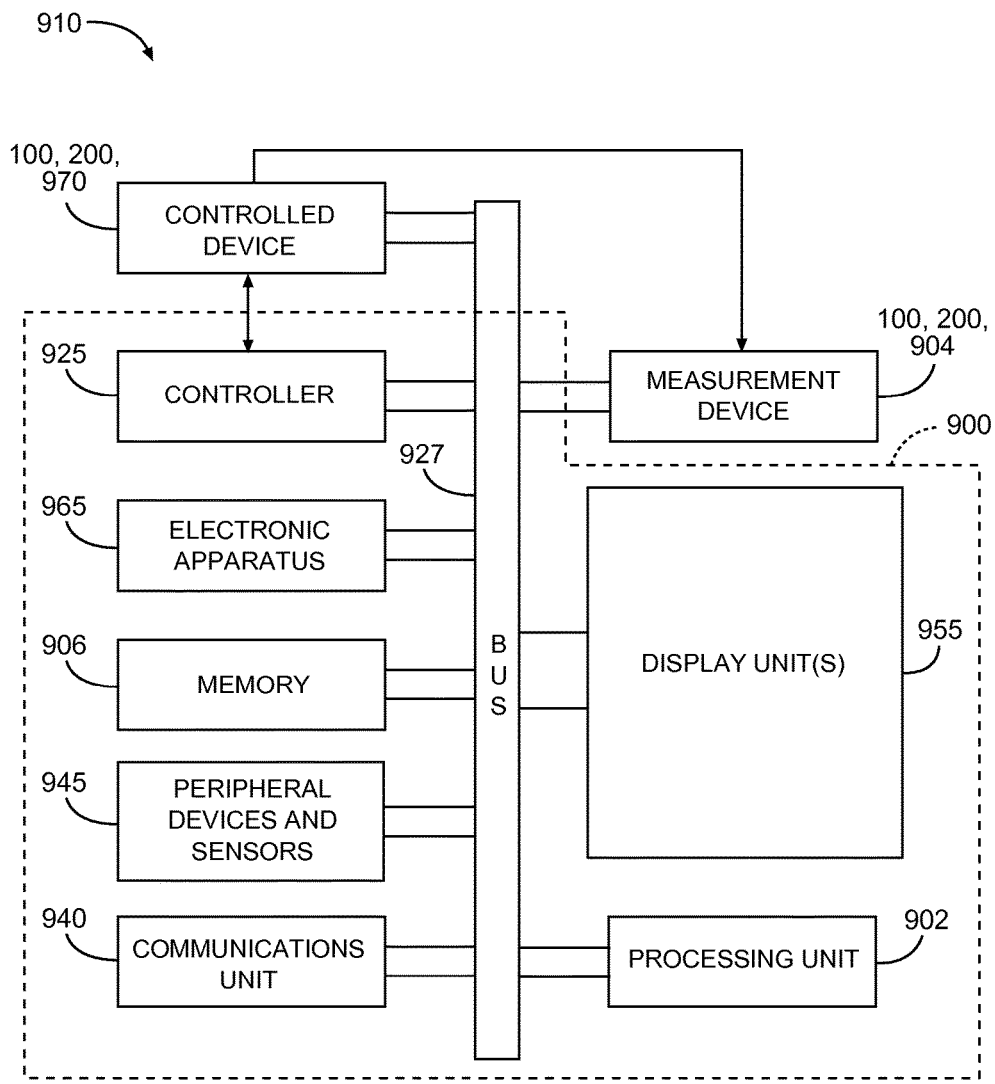
FIG. 9 is a block diagram of a logging system according to various embodiments of the invention.

For example, FIG. 9 is a block diagram of a logging system 910 according to various embodiments of the invention. Referring now to FIGS. 1, 2, and 9, it can be seen that the logging system 910 can receive count measurement data from the antenna arrays 100, 200 acting as controlled devices 970 (e.g., to mechanically or electronically tilt one or more antennas in the arrays 100, 200; and to energize them to transfer energy into the surrounding formation) and measurement devices 904 (e.g., to receive signals corresponding to formation properties, such as resistivity). The logging system 910 thus may include arrays 100, 200 operating in a wellbore.

The processing unit 902 can couple to the measurement device 904 to obtain measurements from the arrays 100, 200 and other devices as described earlier herein. In some embodiments, a logging system 910 comprises one or more of the arrays 100, 200, as well as a housing 900 (see also FIGS. 11-12) that can house the apparatus 904, 970, as well as other elements. The housing might take the form of a wireline tool body, or a downhole tool as described in more detail below with reference to FIGS. 11 and 12. The processing unit 902 may be part of a surface workstation or attached to a downhole tool housing. In some embodiments, the processing unit 902 may be packaged within a housing 120, described earlier herein.

The logging system 910 can include a controller 925, other electronic apparatus 965, and a communications unit 940. The controller 925 and the processing unit 902 can be fabricated to operate the measurement device 904 to acquire measurement data, such as signals corresponding to formation resistivity measurements.

Electronic apparatus 965 (e.g., electromagnetic sensors, etc.) can be used in conjunction with the controller 925 to perform tasks associated with taking measurements downhole, using the measurement device 904. The communications unit 940 can include downhole communications in a wireline or drilling operation. Such downhole communications can include a telemetry system.

The logging system 910 can also include a bus 927 to provide common electrical signal paths between the components of the logging system 910. The bus 927 can include an address bus, a data bus, and a control bus, each independently configured. The bus 927 can also use common conductive lines for providing one or more of address, data, or control, the use of which can be regulated by the controller 925.

The bus 927 can include instrumentality for a communication network. The bus 927 can be configured such that the components of the logging system 910 are distributed. Such distribution can be arranged between downhole components such as the measurement device 904 and components that can be disposed on the surface of a well. Alternatively, several of these components can be co-located such as on one or more collars of a drill string or on a wireline structure.

In various embodiments, the logging system 910 includes peripheral devices that can include displays 955, additional storage memory, or other controlled devices 970 that may operate in conjunction with the controller 925 or the processing unit 902. The display 955 can display diagnostic information for the measurement device 904 based on the signals generated according to embodiments described above. The display 955 can also be used to display one or more graphs, similar to or identical to those illustrated in FIGS. 3-6.

In an embodiment, the controller 925 can be fabricated to include one or more processors. The display 955 can be fabricated or programmed to operate with instructions stored in the processing unit 902 (for example in the memory 906) to implement a user interface to manage the operation of the measurement device 904 or components distributed within the logging system 910. This type of user interface can be operated in conjunction with the communications unit 940 and the bus 927. Various components of the logging system 910 can be integrated with the measurement device 904 and an associated housing 900 such that processing identical to or similar to the methods discussed with respect to various embodiments herein can be performed downhole. Thus, any one or more components of the measurement device 904 and/or controlled device 970 may be attached to or contained within the housing 900.

In various embodiments, a non-transitory machine-readable storage device can comprise instructions stored thereon, which, when performed by a machine, cause the machine to become a customized, particular machine that performs operations comprising one or more features similar to or identical to those described with respect to the methods and techniques described herein. A machine-readable storage device, herein, is a physical device that stores information (e.g., instructions, data), which when stored, alters the physical structure of the device. Examples of machine-readable storage devices can include, but are not limited to, memory 906 in the form of read only memory (ROM), random access memory (RAM), a magnetic disk storage device, an optical storage device, a flash memory, and other electronic, magnetic, or optical memory devices, including combinations thereof.

The physical structure of stored instructions may be operated on by one or more processors such as, for example, the processing unit 902. Operating on these physical structures can cause the machine to perform operations according to methods described herein. The instructions can include instructions to cause the processing unit 902 to store measurement data, look-up tables (e.g., generated by the methods of FIG. 7), and other data in the memory 906. The memory 906 can store the results of measurements of formation parameters or parameters of the arrays 100, 200, to include gain parameters, calibration constants, identification data, etc. The memory 906 therefore may include a database, for example a relational database.

Figure 10:
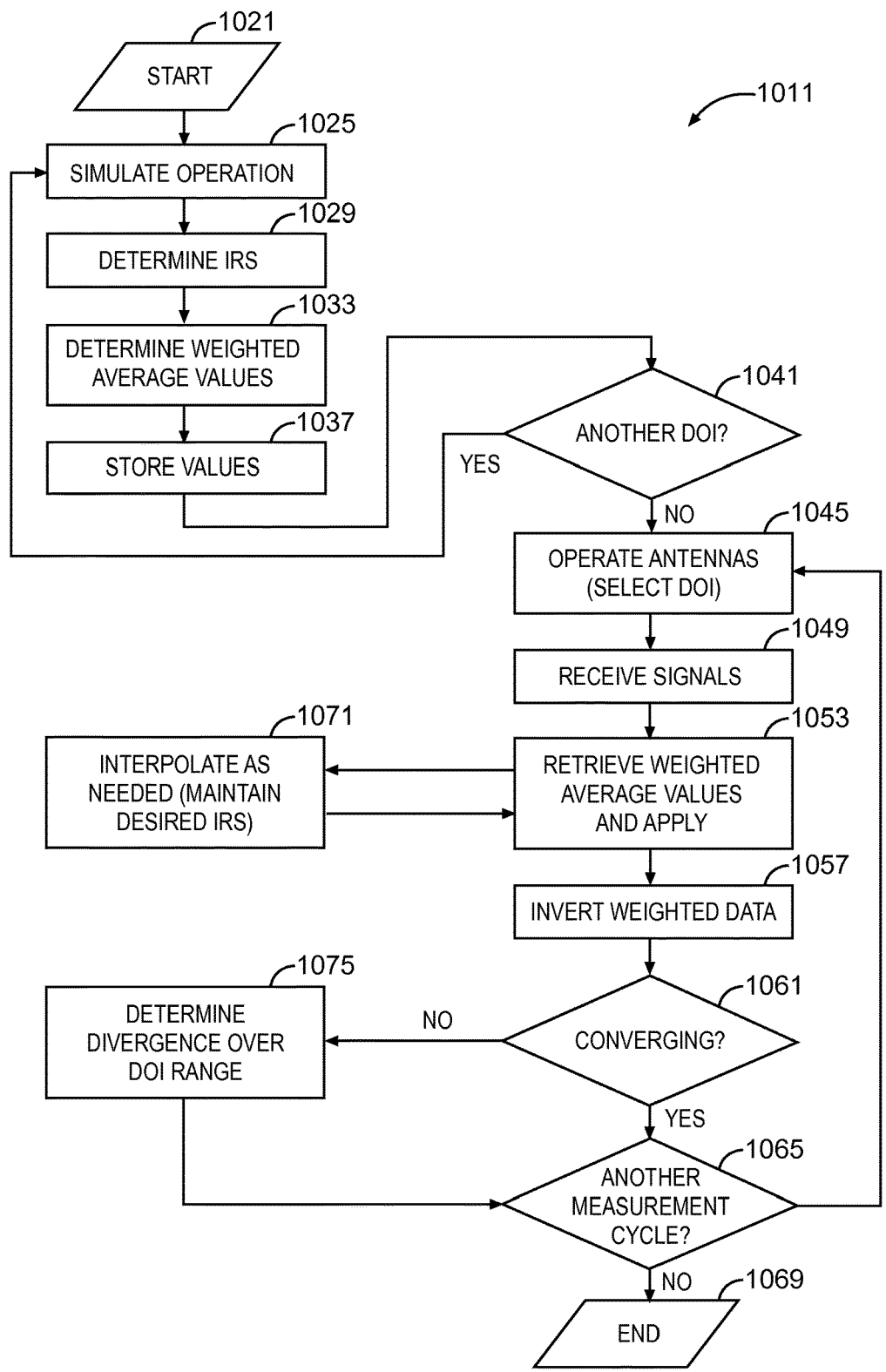
FIG. 10 is a flow diagram illustrating methods of constructing a weight table, and applying weight values to received data to obtain a desired DOI, according to various embodiments of the invention.

FIG. 10 is a flow diagram illustrating methods 1011 of constructing a weight table, and applying weight values to received data to obtain a desired DOI, according to various embodiments of the invention. To begin, methods of weight table construction will be discussed.

Thus, in some embodiments, a method 1011 of constructing a look-up table of measurement data weights, to enable dynamic control of DOI for resistivity or dielectric measurements may begin at block 1021 and go on to block 1025 to include simulating operation of a tilted dipole antenna array in a simulated geological formation to obtain simulated signals over a predetermined range of equivalent magnetic dipole tilt angles and properties of the geological formation.

In some embodiments, the method 1011 may continue on to include determining the integrated radial sensitivity of the array with respect to the range of equivalent magnetic dipole tilt angles at bock 1029.

In some embodiments, the method 1011 may continue on to include determining weighted average values corresponding to the range of equivalent magnetic dipole tilt angles and a desired DOI at block 1033.

The weighted average values may be obtained using a mathematical optimization process. Thus, the activity at block 1033 may comprise selecting the weighted average values to provide a maximal value for the integrated radial sensitivity at the desired DOI.

In some embodiments, the method 1011 may conclude at block 1037 with storing the weight values in a memory, to enable dynamic control of DOI with respect to measuring resistivity or dielectric constant for a real geological formation upon access to and application of the weight values to real signals received by at least two real receiver antennas disposed in a real geological formation.

The activities may be repeated over a range of inspection depths. Thus, the method 1011 may comprise repeating the simulating, determining the integrated radial sensitivity of the array, and determining the weighted average values over a range of depths of investigation. That is, in some embodiments, the method 1011 may return to block 1025 from block 1037, to iterate the activities of blocks 1025, 1029, 1033, and 1037, when data is to be developed for additional depths of investigation, as determined at block 1041.

In some embodiments, the method 1011 may continue on to block 1045 from block 1041, when a sufficient number of weighted average values have been developed and stored.

At block 1045, methods that are used to apply weight values to received data to obtain a desired DOI begin. Thus, at block 1045, a method 1011 may comprise the activity of operating at least a transmitting antenna and at least a receiving antenna as equivalent tilted dipoles. The tilted dipoles provide a selection of equivalent tilt angles for at least one of the transmitting antenna or the receiving antenna, or both.

The DOI may be selected by steering one or more of the antennas. Thus, the activity at block 1045 may comprise selecting the DOI by steering one or more transmitting antennas and/or one or more receiving antennas, to select any number of equivalent tilt angles.

The method 1011 may continue on to block 1049 to include receiving signals by the receiving antennas disposed in a geological formation, the signals to be inverted to obtain at least one of resistivity or dielectric constant properties of the geological formation at a selected DOI, the depth determined by the selection of the equivalent tilt angles and weighting with pre-computed integrated radial sensitivity signal data.

As noted previously (and developed in the method 1011 activities of blocks 1025-1041), a look-up table in a memory may be used to provide weight values that are applied to the signals measured by the receiving antennas. Thus, the method 1011 may continue on to block 1053 to include retrieving weight values corresponding to a desired integrated radial sensitivity level and the depth, to apply to the signals, producing weighted signal data. Often, the weight values are selected to provide the greatest amplitude of response at the selected DOI. Thus, the desired integrated radial sensitivity level may comprise a maximal value.

In some embodiments, data from the look-up table may be used directly for depths of investigation that have been selected and are listed in the table, or interpolated to provide a selected DOI that is not listed directly in the table. Interpolation can be an iterative process. Therefore, the method 1011 may comprise, at block 1071, interpolating between weight values stored in a memory to derive weight values corresponding to the selected DOI, and applying the weight values to the signals, producing weighted signal data. The activity at block 1071 may thus occur on an as-needed basis.

The level of sensitivity can be maintained at the selected depth, across various formation types, in some embodiments. Thus, the activity at block 1071 may include applying weight values corresponding to a desired integrated radial sensitivity level and the depth, to maintain the desired integrated radial sensitivity level across more than one formation type.

The weighted values of the measured signals can be inverted to determine formation resistivity and dielectric constant at a selected DOI. Thus, in some embodiments, the method 1011 may continue on to block 1057 to include inverting the weighted signal data to determine at least one of the resistivity or dielectric constant properties of the geological formation.

When portions of the model are consistent (i.e., self-consistent), then the confidence in results increases. Thus, as measurements are taken at different selected depths of investigation, convergence of the formation properties between depths can be confirmed. Therefore, the method 1011 may comprise, at block 1061, determining convergence of at least one of the resistivity or dielectric properties over a range of the DOI, as a measure of model quality.

If convergence is confirmed, the method 1011 may continue on to block 1065, to determine whether another measurement cycle is desired. If so, the method 1011 may comprise returning to block 1045, and iterating over the activities of blocks 1045-1071. The method 1011 may conclude at block 1069, if no further measurement is desired.

On the other hand, a transition zone may be discovered, as a result of diverging formation property measurements at different depths of investigation. Thus, if convergence is not confirmed at block 1061, the method 1011 may continue on to block 1075 to include determining divergence of the at least one of the resistivity or dielectric properties over a range of the DOI, as a measure of formation transition zone existence. At this point the method 1011 may go on to include the activity at block 1065. Still further embodiments may be realized.

Figure 11:
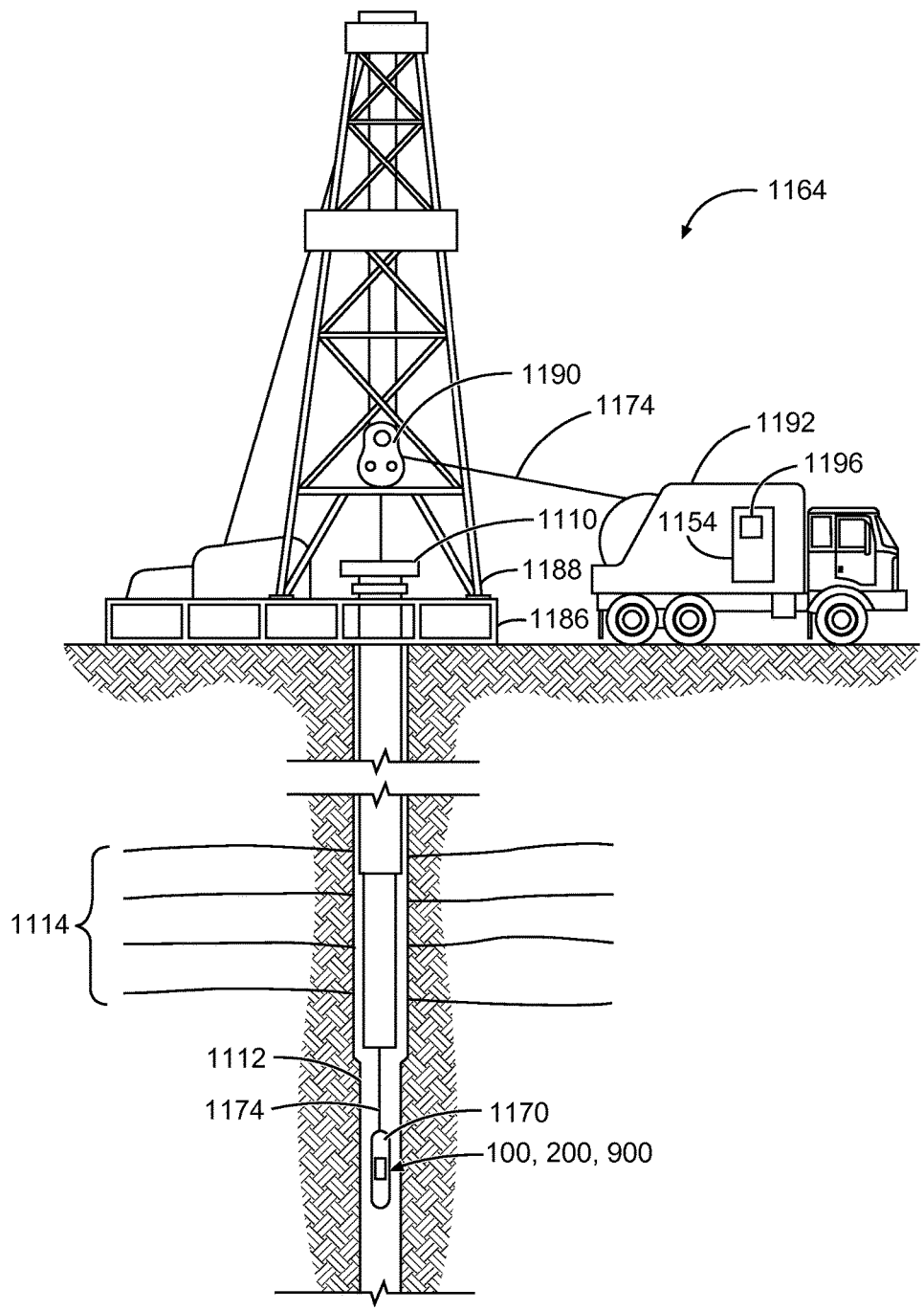
FIG. 11 depicts an example wireline system, according to various embodiments of the invention.
Figure 12:
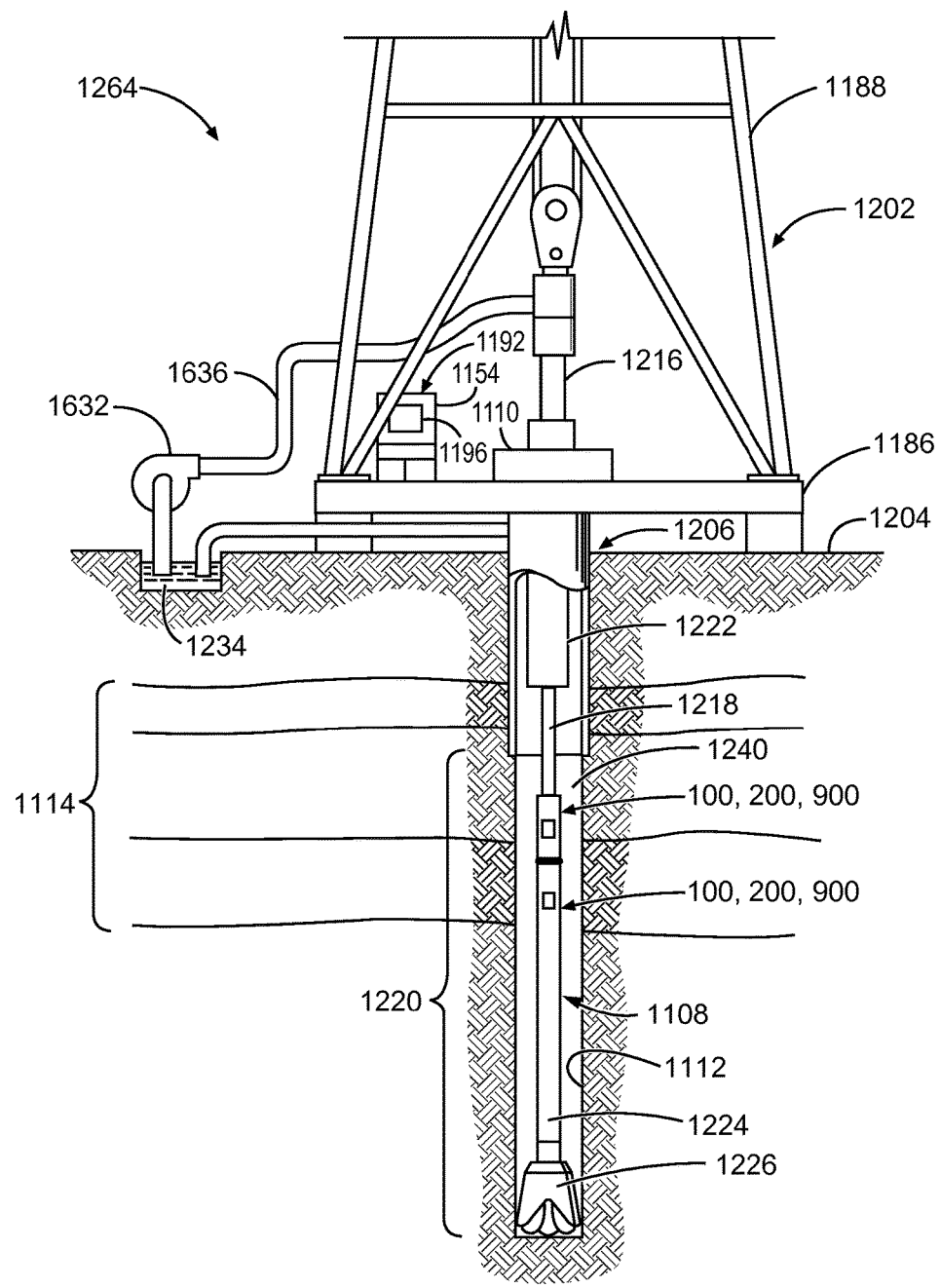
FIG. 12 depicts an example drilling rig system, according to various embodiments of the invention.

For example, as described earlier herein, resistivity and dielectric measurement tools can be used in an LWD assembly or a wireline logging tool. FIG. 11 depicts an example wireline system 1164, according to various embodiments of the invention. FIG. 12 depicts an example drilling rig system 1264, according to various embodiments of the invention. Either of the systems in FIGS. 11 and 12 are operable to control apparatus 100, 200 to conduct measurements in a wellbore. Thus, the systems 1164, 1264 may comprise portions of a wireline logging tool body 1170 as part of a wireline logging operation, or of a downhole tool 1224 (e.g., a drilling operations tool) as part of a downhole drilling operation.

Returning now to FIG. 11, a well during wireline logging operations can be seen. In this case, a drilling platform 1186 is equipped with a derrick 1188 that supports a hoist 1190.

Drilling oil and gas wells is commonly carried out using a string of drill pipes connected together so as to form a drilling string that is lowered through a rotary table 1110 into a wellbore or borehole 1112. Here it is assumed that the drilling string has been temporarily removed from the borehole 1112 to allow a wireline logging tool body 1170, such as a probe or sonde, to be lowered by wireline or logging cable 1174 into the borehole 1112. Typically, the wireline logging tool body 1170 is lowered to the bottom of the region of interest and subsequently pulled upward at a substantially constant speed.

During the upward trip, at a series of depths the instruments (e.g., the arrays 100, 200, or elements of system 910 shown in FIGS. 1, 2, and 9) included in the tool body 1170 may be used to perform measurements on the subsurface geological formations adjacent the borehole 1112 (and the tool body 1170). The measurement data can be communicated to a surface logging facility 1192 for storage, processing, and analysis. The logging facility 1192 may be provided with electronic equipment for various types of signal processing, which may be implemented by any one or more of the components of the system 910 and/or a display 1196 to view the results. Similar formation evaluation data may be gathered and analyzed during drilling operations (e.g., during LWD operations, and by extension, sampling while drilling).

In some embodiments, the tool body 1170 comprises one or more arrays 100, 200 for obtaining and analyzing electromagnetic field measurements in a subterranean formation through a borehole 1112. The tool is suspended in the wellbore by a wireline cable 1174 that connects the tool to a surface control unit (e.g., comprising a workstation 1154, which can also include a display). The tool may be deployed in the borehole 1112 on coiled tubing, jointed drill pipe, hard wired drill pipe, or any other suitable deployment technique.

Turning now to FIG. 12, it can be seen how a system 1264 may also form a portion of a drilling rig 1202 located at the surface 1204 of a well 1206. The drilling rig 1202 may provide support for a drill string 1208. The drill string 1208 may operate to penetrate the rotary table 1110 for drilling the borehole 1112 through the subsurface formations 1114. The drill string 1208 may include a Kelly 1216, drill pipe 1218, and a bottom hole assembly 1220, perhaps located at the lower portion of the drill pipe 1218.

The bottom hole assembly 1220 may include drill collars 1222, a downhole tool 1224, and a drill bit 1226. The drill bit 1226 may operate to create the borehole 1112 by penetrating the surface 1204 and the subsurface formations 1214. The downhole tool 1224 may comprise any of a number of different types of tools including MWD tools, LWD tools, and others.

During drilling operations, the drill string 1208 (perhaps including the Kelly 1216, the drill pipe 1218, and the bottom hole assembly 1220) may be rotated by the rotary table 1110. Although not shown, in addition to, or alternatively, the bottom hole assembly 1220 may also be rotated by a motor (e.g., a mud motor) that is located downhole. The drill collars 1222 may be used to add weight to the drill bit 1226. The drill collars 1222 may also operate to stiffen the bottom hole assembly 1220, allowing the bottom hole assembly 1220 to transfer the added weight to the drill bit 1226, and in turn, to assist the drill bit 1226 in penetrating the surface 1204 and subsurface formations 1214.

During drilling operations, a mud pump 1232 may pump drilling fluid (sometimes known by those of ordinary skill in the art as "drilling mud") from a mud pit 1234 through a hose 1236 into the drill pipe 1218 and down to the drill bit 1226. The drilling fluid can flow out from the drill bit 1226 and be returned to the surface 1204 through an annular area 1240 between the drill pipe 1218 and the sides of the borehole 1112. The drilling fluid may then be returned to the mud pit 1234, where such fluid is filtered. In some embodiments, the drilling fluid can be used to cool the drill bit 1226, as well as to provide lubrication for the drill bit 1226 during drilling operations. Additionally, the drilling fluid may be used to remove subsurface formation cuttings created by operating the drill bit 1226.

Thus, it may be seen that in some embodiments, the systems 1164, 1264 may include a drill collar 1222, a downhole tool 1224, and/or a wireline logging tool body 1170 to house one or more arrays 100, 200 similar to or identical to the arrays 100, 200 shown in FIGS. 1 and 2. Components of the system 910 in FIG. 9 may also be housed by the tool 1224 or the tool body 1170.

Thus, for the purposes of this document, the term "housing" may include any one or more of a drill collar 1222, a downhole tool 1224, or a wireline logging tool body 1170 (all having an outer wall, to enclose or attach to magnetometers, sensors, fluid sampling devices, pressure measurement devices, transmitters, receivers, acquisition and processing logic, and data acquisition systems). The tool 1224 may comprise a downhole tool, such as an LWD tool or MWD tool. The wireline tool body 1170 may comprise a wireline logging tool, including a probe or sonde, for example, coupled to a logging cable 1174. Many embodiments may thus be realized.

For example, a system 1164, 1264 may comprise a downhole tool body, such as a wireline logging tool body 1170 or a downhole tool 1224 (e.g., an LWD or MWD tool body), and one or more arrays 100, 200 attached to the tool body, the arrays 100, 200 to be constructed and operated as described previously.

Thus referring to FIGS. 1-12, it can be seen that in some embodiments an apparatus may comprises one transmitting antenna Tx1, and one receiving antenna R1—or more than one of either antenna (e.g., Tx2, R2, R3, etc.), which can be steered through a variety of polarization angles, or equivalently, dipole tilt angles. That is, a selected polarization angle is electrically equivalent to a dipole tilted at an angle with respect to the longitudinal tool axis.

For example, the equivalent dipole tilt angle for a cavity antenna can be obtained by steering the antenna electrically, such as by changing the magnitude and/or phase of cross-feed inputs. A loop antenna, with a single feed point can be mechanically steered to obtain an equivalent dipole tilt angle (i.e., a selected polarization angle), by physically changing the angle the plane of the antenna forms with respect to the longitudinal tool axis (as shown in FIG. 1). A receiving antenna with a tilt angle $\theta$ closer to 90 degrees with respect to the tool axis will usually have a shallower DOI than will a receiving antenna with a tilt angle $\theta$ closer to 0 degrees.

For the purposes of this document, the "integrated radial sensitivity" or IRS of an antenna is a value that represents some portion of the signal that is received by a magnetic dipole equivalent receiving antenna due to the perturbed response from a given formation at a given depth. The normalized value of the IRS ranges between 0 and 1, where a value of 0.5 at a formation depth of 4 inches, for example, means that 50% of the signal received by the antenna is due to the effect of formation properties ranging over depths from the surface of the formation (0 inches of depth), up to 4 inches into the formation (4 inches of depth) from the face of the receiver. A brief list of several additional embodiments will now be provided.

Referring to FIGS. 1-12, it can be seen that in some embodiments, an apparatus comprises at least a transmitting antenna Tx1 and a receiving antenna R1, steerable to provide equivalent dipoles with a selected tilt angle $\theta$; and a controller 925 to select the selected tilt angle θ of the transmitting antenna Tx1 and the receiving antenna R1, to enable acquisition of signal data by the receiving antenna R1 corresponding to a selected DOI for resistivity and dielectric constant in a geological formation.

The antennas may be constructed or controlled so that steering occurs in synchronous fashion. Thus, the transmitting antenna Tx1 and the receiving antenna R1 may be synchronously steerable. In some embodiments, the antennas Tx1, Tx2 and R1, R2, R3 are electrically steerable, mechanically steerable, or both.

The apparatus may include a memory to store received signal weighting values, to adjust response of the antenna array for different types of formations, and selected depths of investigation. Thus, in some embodiments, the apparatus may comprise a memory 906 accessible by the controller 925, the memory 906 to store a look-up table of measurement data weights corresponding to the selected tilt angle θ and the selected DOI.

One or more of the antennas may comprise an electrically steerable cavity antenna, such as a square cavity antenna or circular cavity antenna, with multiple feed capability. For example, the antenna(s) may permit the use of a cross-feed driving signal, from top to bottom, and from left to right. The energy from each feed can be adjusted to control the polarization angle, and thus, the equivalent dipole tilt angle. The antennas may comprise a truncated waveguide, filled with dielectric, including a rectangular cavity antenna. Thus, in some embodiments, the transmitting antenna Tx1 comprises a multi-feed cavity antenna.

Some embodiments are realized as a system. Thus, in some embodiments, a system 910, 1164, 1264 comprises a housing 900, 1170, 1224; a set of antennas Tx1, Tx2, R1, R2, R3; and a controller 925. In some embodiments, a system 910, 1164, 1264 comprises a downhole tool housing having a longitudinal axis (e.g., the tool 1170 or 1224); at least a transmitting antenna Tx1 and at least a receiving antenna R1 attached to the housing, the transmitting antenna Tx1 and the receiving antenna R1 synchronously steerable to provide an equivalent dipole array with a selected tilt angle. The system 910, 1164, 1264 may further comprise a controller 925 to select the selected tilt angle θ, to enable acquisition of signal data by the receiving antenna R1 corresponding to a selected DOI for at least one physical property in a geological formation in which the housing is disposed.

One or more of the antennas may comprise a cross-feed antenna, including a square cavity antenna or a circular cavity antenna. Thus, in some embodiments, the transmitting antenna(s) Tx1, Tx2 or the receiving antenna(s) R1, R2, R3, or both, comprise a cross-feed, square cavity antenna or circular cavity antenna.

The system can be used in both wireline and drilling applications. Thus, in some embodiments, the downhole tool housing comprises one of a wireline tool housing 1170 or a drill string tool housing 1224.

Any of the above components, for example the arrays 100, 200, or the systems 900, 1164, 1264 (and each of their elements) may all be characterized as "modules" herein. Such modules may include hardware circuitry, and/or a processor and/or memory circuits, software program modules and objects, and/or firmware, and combinations thereof, as desired by the architect of the arrays 100, 200 and systems 900, 1164, 1264 and as appropriate for particular implementations of various embodiments. For example, in some embodiments, such modules may be included in an apparatus and/or system operation simulation package, such as a software electrical signal simulation package, a power usage and distribution simulation package, a power/heat dissipation simulation package, a measured radiation simulation package, and/or a combination of software and hardware used to simulate the operation of various potential embodiments.

It should also be understood that the apparatus and systems of various embodiments can be used in applications other than for logging operations, and thus, various embodiments are not to be so limited. The illustrations of arrays 100, 200 and systems 900, 1164, 1264 are intended to provide a general understanding of the structure of various embodiments, and they are not intended to serve as a complete description of all the elements and features of apparatus and systems that might make use of the structures described herein.

Applications that may include the novel apparatus and systems of various embodiments include electronic circuitry used in high-speed computers, communication and signal processing circuitry, modems, processor modules, embedded processors, data switches, and application-specific modules.

It should be noted that the methods described herein at FIGS. 7-8 and 10 do not have to be executed in the order described, or in any particular order. Moreover, various activities described with respect to the methods identified herein can be executed in iterative, serial, or parallel fashion. Activities in one method may be substituted for those of another method. Information, including parameters, commands, operands, and other data, can be sent and received in the form of one or more carrier waves.

Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that may be employed to create one or more software programs designed to implement and perform the methods disclosed herein. For example, the programs may be structured in an object-orientated format using an object-oriented language such as Java or C#. In another example, the programs can be structured in a procedure-orientated format using a procedural language, such as assembly or C. The software components may communicate using any of a number of mechanisms well known to those of ordinary skill in the art, such as application program interfaces or interprocess communication techniques, including remote procedure calls. The teachings of various embodiments are not limited to any particular programming language or environment.

In summary, using the apparatus, systems, and methods disclosed herein may provide increased gain stability with respect to gamma ray measurement tools operating in the presence of sensor sensitivity drift, temperature extremes, vibration, or other environmental or design factors relative to conventional mechanisms. These advantages can significantly enhance the value of the services provided by an operation/exploration company, helping to reduce time-related costs.

Current tools for downhole determination of resistivity and dielectric constant often lack the ability to measure formation properties with a controllable DOI. This disclosure presents apparatus, systems, and methods that allow the inversion of data from a dielectric tool, for example, at a desired DOI, reducing uncertainty as the DOI varies over different formation materials. This provides consistent, accurate measurement results, and in turn, increased customer satisfaction.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

Although specific embodiments have been illustrated and described herein, it will be appreciated by those of ordinary skill in the art that any arrangement that is calculated to achieve the same purpose may be substituted for the specific embodiments shown. Various embodiments use permutations or combinations of embodiments described herein. It is to be understood that the above description is intended to be illustrative, and not restrictive, and that the phraseology or terminology employed herein is for the purpose of description. Combinations of the above embodiments and other embodiments will be apparent to those of ordinary skill in the art upon studying the above description.

What is claimed is:

1. An apparatus, comprising:
   at least a transmitting antenna and a receiving antenna of a downhole tool housing, wherein the transmitting antenna and receiving antenna are steerable to provide equivalent dipoles with a selected tilt angle of a plurality of tilt angles with respect to a longitudinal axis of the downhole tool housing; and
   a controller to select the selected tilt angle of the transmitting antenna and the receiving antenna, to enable acquisition of signal data by the receiving antenna corresponding to a selected depth of investigation for resistivity and dielectric constant in a geological formation.

2. The apparatus of claim 1, wherein the transmitting antenna and the receiving antenna are synchronously steerable.

3. The apparatus of claim 1, wherein the transmitting antenna and the receiving antenna are electrically steerable.

4. The apparatus of claim 1, further comprising:
   a memory accessible by the controller, the memory to store a look-up table of measurement data weights corresponding to the selected tilt angle and the selected depth of investigation.

5. The apparatus of claim 1, wherein the transmitting antenna comprises a multi-feed cavity antenna.

6. A system, comprising:
   a downhole tool housing having a longitudinal axis;
   at least a transmitting antenna and a receiving antenna attached to the housing, the transmitting antenna and the receiving antenna synchronously steerable to provide an equivalent dipole array with a selected tilt angle of a plurality of tilt angles with respect to the longitudinal axis of the downhole tool housing; and
   a controller to select the selected tilt angle, to enable acquisition of signal data by the receiving antenna corresponding to a selected depth of investigation for at least one physical property in a geological formation in which the housing is disposed.

7. The system of claim 6, wherein at least one of the transmitting antenna or the receiving antenna comprise a cross-feed, square cavity antenna or circular cavity antenna.

8. The system of claim 6, wherein the downhole tool housing comprises one of a wireline tool housing or a drill string tool housing.

9. The system of claim 6, further comprising:
   a memory accessible by the controller, the memory to store a look-up table of measurement data weights corresponding to the selected tilt angle and the selected depth of investigation.

10. A method comprising:
    operating at least a transmitting antenna and a receiving antenna as equivalent tilted dipoles, wherein the tilted dipoles provide a selection of equivalent tilt angles for at least one of the transmitting antenna or the receiving antenna; and
    receiving signals by the receiving antenna disposed in a geological formation, the signals to be inverted to obtain at least one of resistivity or dielectric constant properties of the geological formation at a selected depth of investigation, the depth determined by the selection of the equivalent tilt angles and weighting with pre-computed integrated radial sensitivity signal data.

11. The method of claim 10, further comprising:
    retrieving weight values corresponding to a desired integrated radial sensitivity level and the depth, to apply to the signals, producing weighted signal data.

12. The method of claim 11, wherein the desired integrated radial sensitivity level is a maximal value.

13. The method of claim 10, further comprising:
    interpolating between weight values stored in a memory to derive weighting values corresponding to the selected depth of investigation; and
    applying the weighting values to the signals, producing weighted signal data.

14. The method of claim 11, further comprising:
    inverting the weighted signal data to determine at least one of the resistivity or dielectric constant properties of the geological formation.

15. The method of claim 10, further comprising:
    determining convergence of at least one of the resistivity or dielectric properties over a range of the depth of investigation, as a measure of model quality.

16. The method of claim 10, further comprising:
    determining divergence of the at least one of the resistivity or dielectric properties over a range of the depth of investigation, as a measure of formation transition zone existence.

17. The method of claim 10, further comprising:

selecting the depth of investigation by steering at least one of the transmitting antenna or the receiving antenna to select one of the equivalent tilt angles.

18. The method of claim 10, further comprising:

applying weight values corresponding to a desired integrated radial sensitivity level and the depth, to maintain the desired integrated sensitivity level across more than one formation type.

19. A method, comprising:

simulating operation of a tilted dipole antenna array in a simulated geological formation to obtain simulated signals over a predetermined range of equivalent magnetic dipole tilt angles and properties of the geological formation;

determining integrated radial sensitivity of the array with respect to the range of equivalent magnetic dipole tilt angles;

determining weight values corresponding to the range of equivalent magnetic dipole tilt angles and a desired depth of investigation; and storing the weight values in a memory, to enable dynamic control of depth of investigation with respect to measuring resistivity or dielectric constant for a real geological formation upon access to and application of the weight values to real signals received by one or more real receiver antennas disposed in a real geological formation to generate weighted averaged values.

20. The method of claim 19, further comprising:

repeating the simulating, determining the integrated radial sensitivity of the array, and determining the weighted average values over a range of depths of investigation.

21. The method of claim 19, wherein determining the weighted average values comprises:

selecting the weighted average values to provide a maximal value for the integrated radial sensitivity at the desired depth of investigation.

* * * * *